(12) United States Patent
DeJaco

(10) Patent No.: US 6,205,130 B1
(45) Date of Patent: *Mar. 20, 2001

(54) METHOD AND APPARATUS FOR DETECTING BAD DATA PACKETS RECEIVED BY A MOBILE TELEPHONE USING DECODED SPEECH PARAMETERS

(75) Inventor: Andrew P. DeJaco, San Diego, CA (US)

(73) Assignee: Qualcomm Incorporated, San Diego, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/719,358

(22) Filed: Sep. 25, 1996

(51) Int. Cl.[7] .............. H04B 7/216; H04B 1/10; G01L 21/00; H04L 5/12
(52) U.S. Cl. .............. 370/335; 704/220; 455/212; 455/296; 375/264
(58) Field of Search ................... 370/335, 342, 370/252; 445/63, 221, 222, 212, 225, 226.1, 296, 303, 312; 371/5.5, 51; 375/200, 224, 240, 350, 241; 704/264, 220, 221, 222, 223, 224, 228, 219

(56) References Cited

U.S. PATENT DOCUMENTS

| 5,142,582 | * | 8/1992 | Asakawa et al. | 704/228 |
|---|---|---|---|---|
| 5,309,443 | * | 5/1994 | Schorman | 371/5.5 |
| 5,414,796 | | 5/1995 | Jacobs et al. | 395/2.3 |
| 5,497,383 | * | 3/1996 | Thome et al. | 371/5.5 |
| 5,537,410 | * | 7/1996 | Li | 370/465 |
| 5,550,543 | * | 8/1996 | Chen et al. | 375/350 |
| 5,557,639 | * | 9/1996 | Heikkila et al. | 375/224 |
| 5,619,508 | * | 4/1997 | Davis et al. | 370/495 |
| 5,699,481 | * | 12/1997 | Shlomot et al. | 370/505 |
| 5,815,507 | * | 9/1998 | Vinggaard et al. | 371/5.1 |
| 5,862,518 | * | 1/1999 | Nomura et al. | 704/214 |
| 5,867,814 | * | 2/1999 | Yong | 704/221 |

FOREIGN PATENT DOCUMENTS

| 8909965 | 10/1989 | (WO) | G06F/11/10 |
|---|---|---|---|
| 9429849 | 12/1994 | (WO) | G10L/9/18 |
| 9609704 | 3/1996 | (WO) | H04L/1/20 |
| 9618251 | 6/1996 | (WO) | H04L/1/20 |
| 9619798 | 6/1996 | (WO) | G10L/9/14 |

OTHER PUBLICATIONS

D. Sereno, "Frame substitution and adaptive post–filtering in speech coding", *CSELT Technical Reports*, vol. XX—No. 1, Mar. 1992, pp. 15–19.

* cited by examiner

*Primary Examiner*—Chi H. Pham
*Assistant Examiner*—Steven Nguyen
(74) *Attorney, Agent, or Firm*—Philip R. Wadsworth; Thomas R. Rouse; Sean English

(57) ABSTRACT

The mobile telephone detects bad data packets by decoding speech parameters represented by the packets and comparing those speech parameters against acceptable ranges of speech parameters. If the speech parameters do not lie within the acceptable ranges, the packets are discarded. This speech parameter-based detection of bad data packets is particularly useful in mobile telephones receiving variable rate data packets wherein an error in determining the rate of a packet results in the entire packet being decoded at an incorrect rate, thereby likely causing an annoying audible artifact in the decode speech signal. Such rate detection errors can occur even though a CRC or other conventional error detection check fails to detect the bad packet. In an exemplary implementation, the mobile telephone receives signals encoded with TIA/EIA/IS-95-A standards. Linear speech parameter frequencies and codebook gain parameters determined using linear predictive coding techniques are tested against acceptable ranges to detect bad data packets.

19 Claims, 5 Drawing Sheets

METHOD AND APPARATUS FOR DETECTING BAD DATA PACKETS RECEIVED BY A MOBILE TELEPHONE USING DECODED SPEECH PARAMETERS

BACKGROUND OF THE INVENTION

I. Field of the Invention

The invention generally relates to mobile telephone systems employing Code Division Multiple Access (CDMA) and in particular to techniques for detecting bad data packets.

II. Description of the Related Art

FIG. 1 is an illustrative block diagram of a variable rate CDMA transmission system 10 described in the Telecommunications Industry Association's Interim Standard TIA/EIA/IS-95-A Mobile Station-Base Station Compatibility Standard for Dual-Mode Wideband Spread Spectrum Cellular System. This transmission system may be provided, for example, within a base station of a cellular transmission system for use in transmitting signals to mobile telephones within a cell surrounding the base station.

A microphone 11 detects a speech signal which is then sampled and digitized by an analog to digital converter (not shown). A variable rate data source 12 receives the digitized samples of the speech signal and encodes the signal to provide packets of encoded speech of equal frame lengths. Variable rate data source 12 may, for example, convert the digitized samples of the input speech to digitized speech parameters representative of the input voice signal using Linear Predictive Coding (LPC) techniques. In the exemplary embodiment, the variable rate data source is a variable rate vocoder as described in detail in U.S. Pat. No. 5,414,796 which is assigned to the assignee of the present invention and is incorporated by reference herein. Variable rate data source 12 provides variable rate packets of data at four possible frame rates 9600 bps, 4800 bps, 2400 bps and 1200 bps, referred to herein as full, half, quarter, and eighth rates. Packets encoded at full rate contain 172 information bits, samples encoded at half rate contain 80 information bits, samples encoded at quarter rate contain 40 information bits and samples encoded at eighth rate contain 16 information bits. Packet formats are shown in FIGS. 2A–2D. The packets regardless of size all are one frame length in duration, i.e. 20 ms. Herein, the terms "frame" and "packet" may be used interchangeably.

The packets are encoded and transmitted at different rates to compress the data contained therein based, in part, on the complexity or amount of information represented by the frame. For example, if the input voice signal includes little or no variation, perhaps because the speaker is not speaking, the information bits of the corresponding packet may be compressed and encoded at eighth rate. This compression results in a loss of resolution of the corresponding portion of the voice signal but, given that the corresponding portion of the voice signal contains little or no information, the reduction in signal resolution is not typically noticeable. Alternatively, if the corresponding input voice signal of the packet includes much information, perhaps because the speaker is actively vocalizing, the packet is encoded at full rate and the compression of the input speech is reduced to achieve better voice quality.

This compression and encoding technique is employed to limit, on the average, the amount of signals being transmitted at any one time to thereby allow the overall bandwidth of the transmission system to be utilized more effectively to allow, for example, a greater number of telephone calls to be processed at any one time.

The variable rate packets generated by data source 12 are provided to packetizer 13 which selectively appends cyclic redundancy check (CRC) bits and tail bits. As shown in FIG. 2A, when a frame is encoded by the variable rate data source 12 at full rate, packetizer 13 generates and appends twelve CRC bits and eight tail bits. Similarly, as shown in FIG. 2B, when a frame is encoded by the variable rate data source 12 at half rate, packetizer 13 generates and appends eight CRC bits and eight tail bits. As shown in FIG. 2C, when a frame is encoded by the variable rate data source 12 at quarter rate, packetizer 13 generates and appends eight tail bits. As shown in FIG. 2D, when a frame is encoded by the variable rate data source 12 at eighth rate, packetizer 13 generates and appends eight tail bits.

The variable rate packets from packetizer 13 are then provided to encoder 14 which encodes the bits of the variable rate packets for error detection and correction purposes. In the exemplary embodiment, encoder 14 is a rate ⅓ convolutional encoder. The convolutionally encoded symbols are then provided to a CDMA spreader 16, an implementation of which is described in detail in U.S. Pat. Nos. 5,103,459 and 4,901,307. CDMA spreader 16 maps eight encoded symbols to a 64 bit Walsh symbol and then spreads the Walsh symbols in accordance with a pseudorandom noise (PN) code.

Repetition generator 17 receives the spread packets. For packets of less than full rate, repetition generator 17 generates duplicates of the symbols in the packets to provide packets of a constant data rate. When the variable rate packet is half rate, then repetition generator 17 introduces a factor of two redundancy, i.e. each spread symbol is repeated twice within the output packet. When the variable rate packet is quarter rate, then repetition generator 17 introduces a factor of four redundancy. When the variable rate packet is eighth rate then repetition generator 17 introduces a factor of eight redundancy.

Repetition generator 17 provides the aforementioned redundancy by dividing the spread data packet into smaller sub-packets referred to as "power control groups". In the exemplary embodiment, each power control group consists of 6 PN spread Walsh Symbols. The constant rate frame is generated by consecutively repeating each power control group the requisite number of times to fill the frame as described above.

The spread packets are then provided to a data burst randomizer 18 which removes the redundancy from the spread packets in accordance with a pseudorandom process as described in copending U.S. patent application Ser. No. 08/291,231, filed Aug. 16, 1994 assigned to the assignee of the present invention. Data burst randomizer 18 selects one of the spread power control groups for transmission in accordance with a pseudorandom selection process and gates the other redundant copies of that power control group.

The packets are provided by data burst randomizer 18 to finite impulse response (FIR) filter 20, an example of which is described in U.S. patent application Ser. No. 08/194,823, and assigned to the assignee of the present invention. The filtered signal is then provided to digital to analog converter 22 and converted to an analog signal. The analog signal is then provided to transmitter 24 which upconverts and amplifies the signal for transmission through antenna 26.

FIG. 3 illustrates pertinent components of a mobile telephone 28 or other mobile station receiving the transmitted signal. The signal is received by antenna 30, downconverted and amplified, if necessary, by receiver 32. The signal is then provided to frame rate detection unit 33 which subdivides the signal into packets and determines the corresponding frame rate for each packet. The frame rate may be determined, depending upon the implementation, by detecting the duration of individual bits of the frame. The packet and a signal identifying the detected frame rate for the packet are then forwarded to CRC unit 34 for performing cyclic redundancy checks or related error detection checks in an attempt to verify that no transmission errors or frame rate detection errors occurred. A frame rate detection error results in the packet being sampled at an incorrect rate resulting in a sequence of bits that are effectively random. A transmission error typically results in only one or two bits being in error. Usually, if a transmission error or frame rate detection error occurs, the CRC unit detects the error. "Bad" frames failing the CRC are erased or otherwise discarded by frame erasure unit 36. "Good" frames which pass the CRC are routed to variable rate decoder 40 for conversion back to digitized voice signals. The digitized voice signals are converted to analog signals by a digital to analog converter (not shown) for ultimate output through a speaker 42 of the mobile telephone.

Depending upon the implementation, no separate frame erasure unit 36 is necessarily required. Rather, CRC unit 34 may be configured merely to not output bad frames to variable rate decoder 40. However, provision of a frame erasure unit facilitates generation of frame erasure signals for forwarding back to the base station to notify the base station of the frame erasure error. The base station may use the framer erasure information to modulate the amount of power employed to transmit signals perhaps as part of a feedback system intended to minimize transmitted power while also minimizing frame errors.

As noted above, by varying the frame rate of packets to thereby compress the information contained therein, the overall bandwidth of the system is utilized more effectively, usually without any noticeable effect on the transmitted signal. However, problems occur occasionally which have a noticeable effect. One such problem occurs if a frame subject to a frame rate detection error or a transmission error nevertheless passes the CRC. In such case, the bad frame is not erased but is processed along with other good frames. The error may or may not be noticeable. For example, if the error is a transmission error wherein only one or two bits of encoded speech are in error, the error may have only an extremely slight and probably unnoticeable effect on the output voice signal. However, if the error is a frame rate detection error, the entire packet will thereby be processed using the incorrect frame rate causing effectively random bits to be input to the decoder likely resulting in a noticeable artifact in the output voice signal. For some systems, it has been found that incorrect frame rate detections occur with a probability of about 0.005% yielding an incorrectly received packet and a corresponding artifact in the output voice signal about every sixteen minutes of conversation time. Although described with respect to a CDMA system using TIA/EIA IS-95-A protocols, similar problems can occur in almost any transmission system employing variable transmission rates and in related systems as well.

It would be desirable to remedy the forgoing problem, and it is to that end that the invention is primarily drawn.

SUMMARY OF THE INVENTION

In accordance with one aspect of the invention, a signal reception system is provided for use in a mobile telephone system. The signal reception system includes a means for receiving a digitized signal containing speech parameters representative of speech; a means for examining the digitized signal to identify atypical portions of the digitized signal; and a means for eliminating atypical portions of the signal found by the means for examining. The atypical portions are those likely to be erroneous. Depending upon the implementation, the means for examining the digitized signal to identify atypical portions thereof includes a means for comparing the speech parameters of the portions of the digitized signal with predetermined ranges of acceptable speech parameters to identify portions having speech parameters outside of the predetermined ranges. Exemplary types of speech parameters include codebook gain parameters or linear speech predictor (LSP) frequencies.

Hence, a system is provided wherein the actual speech parameters represented by a received digitized speech signal are examined to identify portions of the signal which are atypical and are thereby likely to be erroneous, perhaps as a result of undetected signal transmission errors. For example, if a portion of the received signal is found to have speech parameters representative of very high frequencies not ordinarily found in human speech, the system identifies that portion of the signal as being atypical and eliminates that portion thereby avoiding a potentially annoying transmission error artifact in the speech signal ultimately output to a listener.

In one specific implementation, the foregoing system is provided within a mobile telephone configured to receive signals encoded with TIA/EIA/IS-95-A standards. The signal includes variable rate data packets encoded at potentially different frame rates. Means are provided for detecting the frame rate of each data packet. As noted, an error may occur during detection of the frame rate thereby resulting in the processing of an entire packet using an incorrect frame rate and thus likely resulting in an annoying artifact in the speech signal ultimately provided to the listener. With the invention, such packets are detected and eliminated.

Moreover, principles of the invention may be advantageously employed in other signal reception systems as well. Indeed, principles of the invention may be employed in many systems wherein, following otherwise conventional error detection, some amount of redundancy still remains in a received signal. This redundancy can be exploited to allow signals of very low probability to be distinguished from signals of higher probability thereby allowing elimination of the signals having very low probability on the basis that such signals are probably erroneous signals.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

With reference to the remaining figures, exemplary embodiments of the invention will now be described. The exemplary embodiments will primarily be described with reference to block diagrams and flow charts. As to the flowcharts, each block therein represents both a method step and an apparatus element for performing the recited method step. Depending upon the implementation, each apparatus element, or portions thereof, may be configured in hardware, software, firmware or combinations thereof. Also, it should be appreciated that not all components necessary for a complete implementation of a practical system are illustrated or described in detail. Rather, only those components necessary for a thorough understanding of the invention are illustrated and described.

Figure 1:
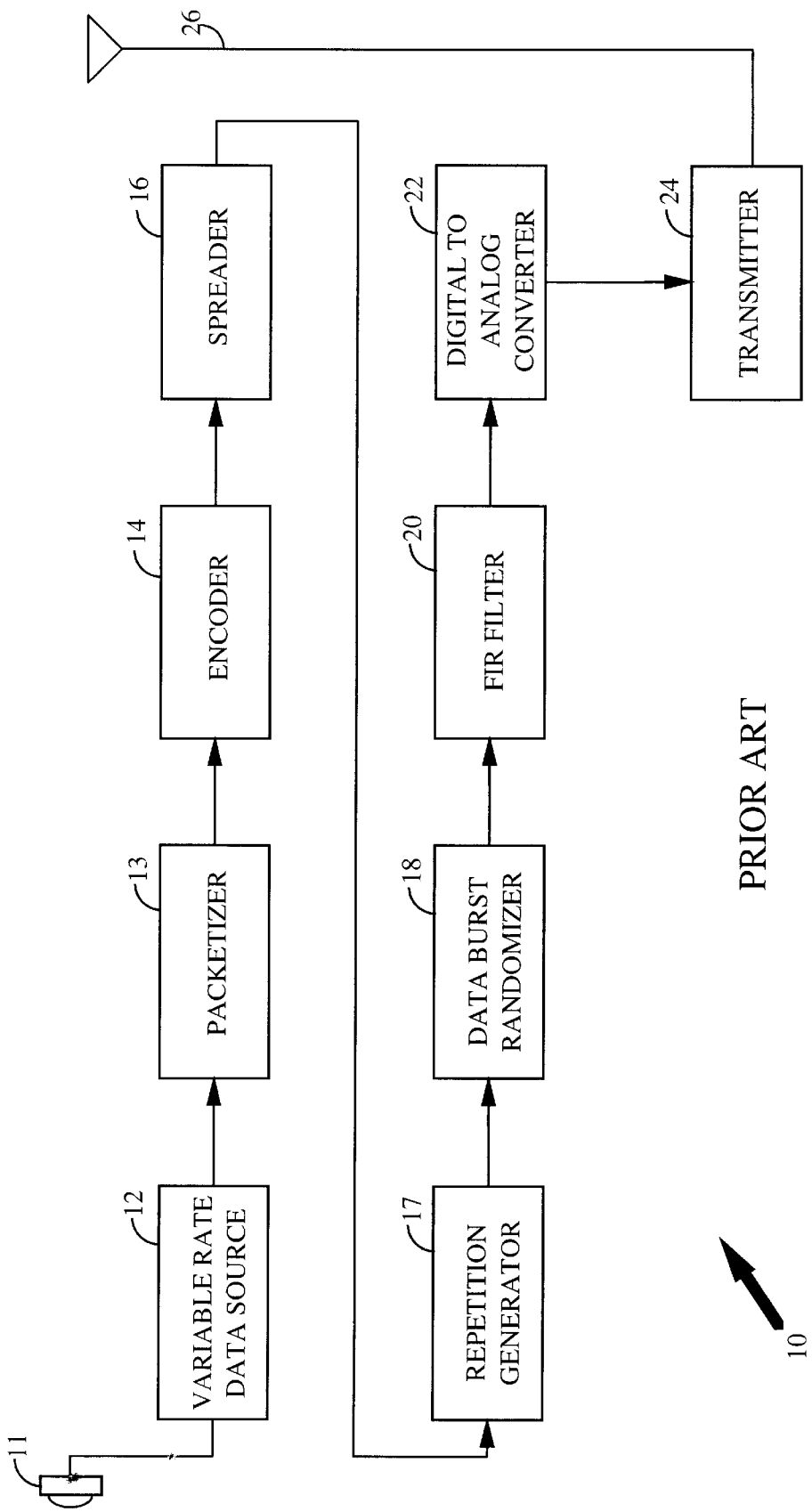
FIG. 1 is a is a block diagram of a transmit portion of a digital cellular telephone system base station.
Figure 2A:
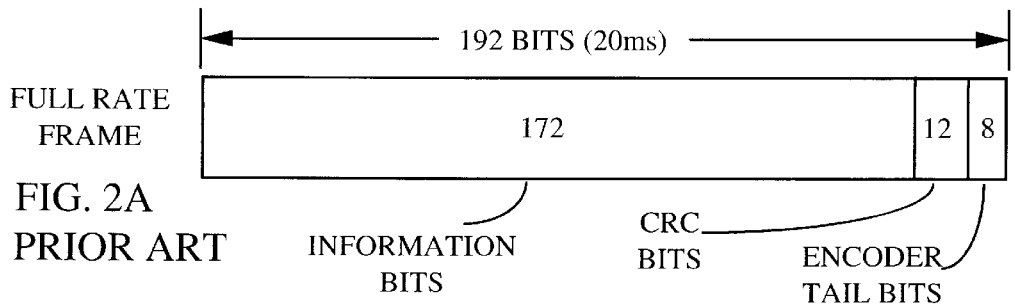
FIGS. 2A–2D are illustrations of frame formats employed by the system of FIG. 1.
Figure 2B:
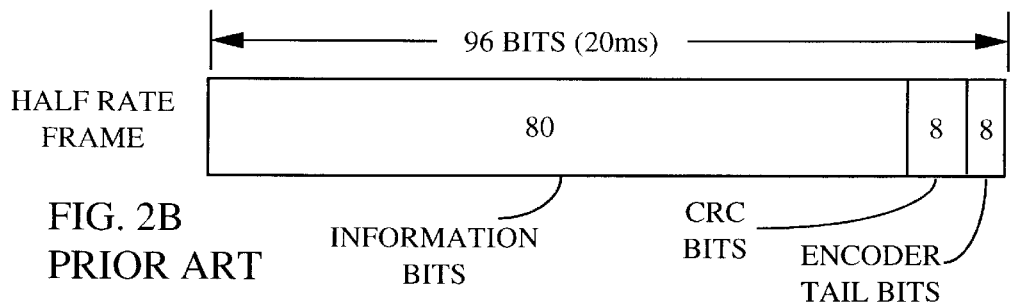
Figure 2C:
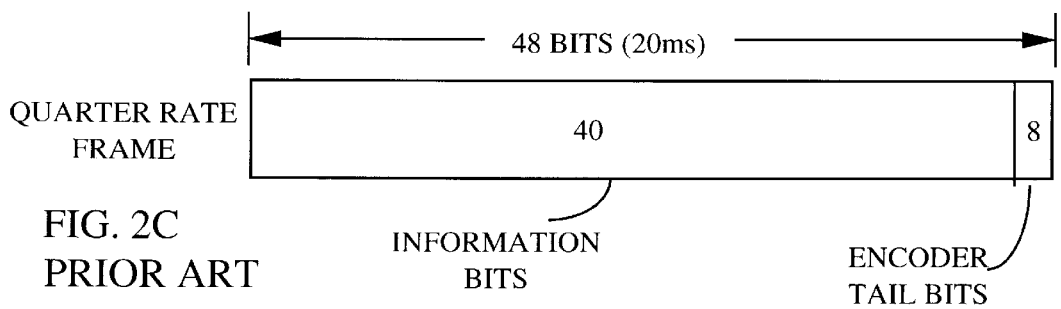
Figure 2D:
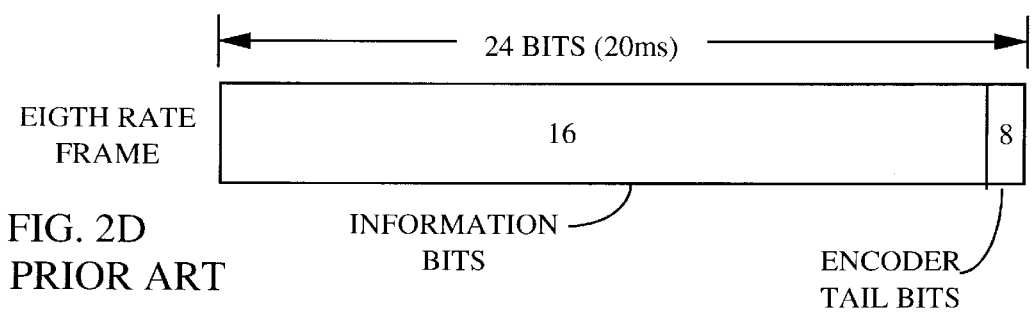
Figure 4:
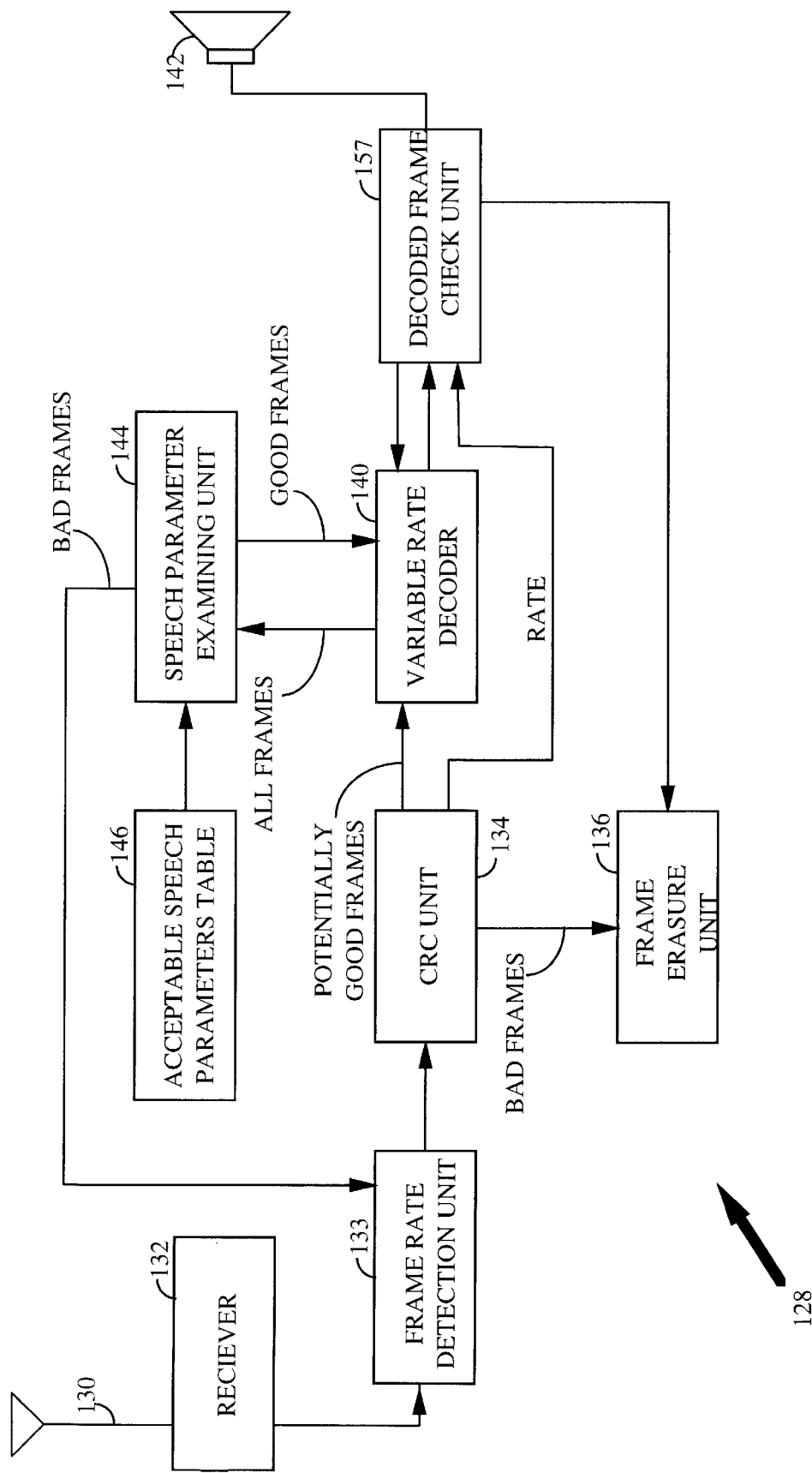
FIG. 4 is a block diagram of a receive portion of a cellular telephone, configured in accordance with the invention with a speech parameter-based bad frame detection unit, for receiving signals transmitted by the system of FIG. 1.

FIG. 4 illustrates pertinent components of a mobile telephone 128 or other mobile station receiving a signal provided by a base station transmission system such as the one of FIG. 1 wherein a signal having variable rate packets is transmitted. Frame rates include full rate, half rate, quarter rate and eighth rate as shown in FIGS. 2A–2D. The packets include encoded speech parameters representative of a compressed voice signal. In addition, each packet includes CRC bits and/or encoder tail bits. Additional details regarding the content of the packets is provided above in connection with FIG. 1 and in U.S. Pat. No. 5,414,796 referenced above.

Figure 3:
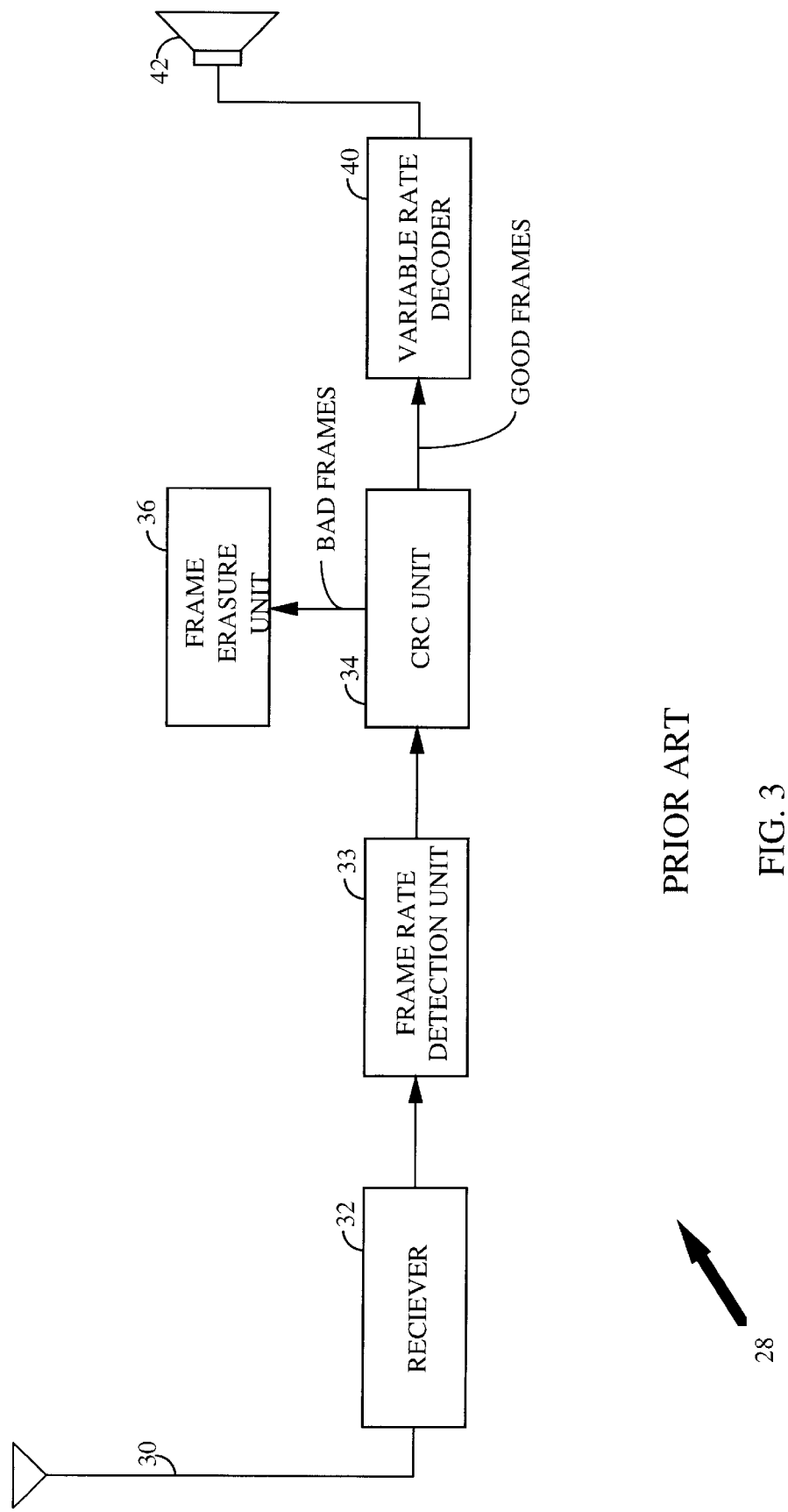
FIG. 3 is a block diagram of a receive portion of a cellular telephone, configured without the invention, for receiving signals transmitted by the system of FIG. 1.

The illustrated components of FIG. 4 are similar to those of FIG. 3 and only pertinent differences will be described in detail. The transmitted signal is received by antenna 130, downconverted and amplified by receiver 132. The signal is then provided to a frame rate detection unit 133 which attempts to determine the corresponding frame rate for the packet. The packet is then provided to a CRC unit 134 for performing cyclic redundancy checks on frames of the received signal in an attempt to verify that no frame rate detection error or transmission error occurred. Frames failing the CRC, i.e. bad frames, are erased by frame erasure unit 136. As noted above, no separate frame erasure unit is necessarily required. Rather, frames subject to CRC errors may merely not be output from CRC unit. In any case, frames which pass the CRC, i.e. potentially good frames, are routed to a variable rate decoder 140 which decodes any speech parameters contained therein for conversion back to digitized voice signals. The digitized voice signals are ultimately converted to analog signals by a digital to analog converter (not shown) for output through a speaker 142 of the mobile telephone to a listener.

During processing, speech parameters decoded by variable rate decoder 140 are routed to a speech parameter examining unit 144 which determines whether the decoded speech parameters lie within predetermined acceptable ranges of speech parameters stored within an acceptable speech parameters table 146. Only frames having data parameters within the acceptable ranges specified by table 146 are returned to variable rate decoder 140 and used for generating the digitized speech signal ultimately output via speaker 142. All other frames are routed to frame erasure unit 136.

Figure 5:
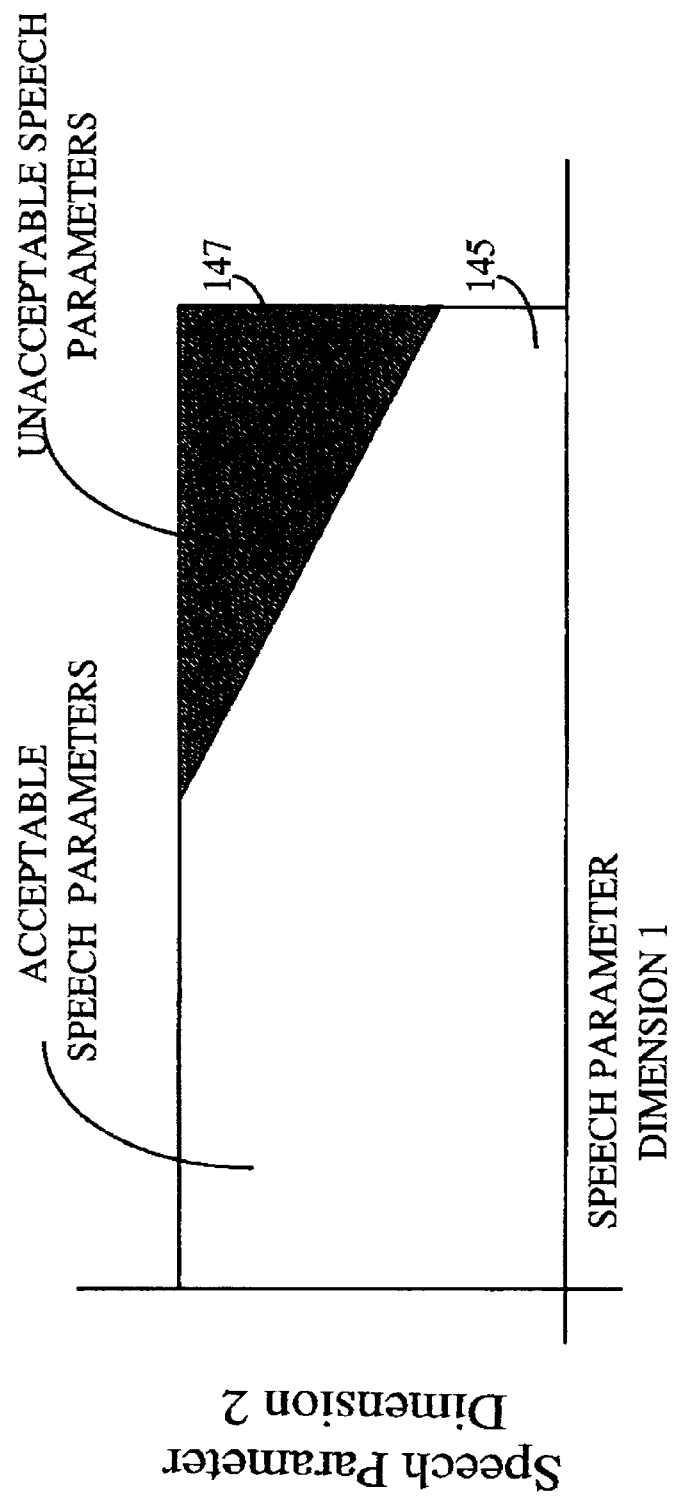
FIG. 5 is graph illustrating an exemplary range of acceptable speech parameters.

Thus, speech parameter examining unit 144 compares decoded speech parameters with acceptable ranges to identify frames containing speech parameters that lie outside the acceptable ranges. FIG. 5 graphically illustrates an acceptable range of speech parameters 145 for a system wherein two speech parameter dimensions are evaluated. For example, one dimension may represent LSP frequencies and the other codebook gain parameters, but in general any appropriate characteristics of the encoded speech signal may be utilized. A range of unacceptable speech parameters 147 is also illustrated in FIG. 5.

Depending upon the implementation, the acceptable ranges of speech parameters may be predetermined based upon the probability of encountering certain speech parameters in typical, transmitted human speech. For example, there is a low probability that transmitted human speech contains extremely low or high frequencies. Hence, the speech parameters may be examined to determine the corresponding frequency and if the frequency is found to be above or below certain predetermined thresholds specified in the acceptable speech range table 146, the system concludes that the speech parameters are incorrect. Of course, there is the possibility that the low probability speech parameters are perfectly correct, resulting in an erroneous frame erasure. Care should be taken to select the acceptable ranges of speech parameters to minimize the likelihood of unnecessary frame erasures. In this regard, acceptable speech parameter ranges may be determined empirically by evaluating the probabilities of encountering various speech parameters in typical speech and in other typical sounds expected to be transmitted including tones, dtmf signals, music, background noise etc. The resulting ranges may be tested against input signals known to be correct to identify the likelihood of unnecessary frame erasures and then adjusted accordingly. For systems capable of transmitting data as well as voice signals, the speech parameter-based frame erasure mechanism is preferably disabled during data transmissions.

Also, the acceptable ranges of speech parameters stored in table 146 may be tailored to the community expected to utilize the mobile telephone. For example, the acceptable ranges may be set differently for mobile telephones employed in communities where English is expected to be spoken as opposed to communities where another language having significantly different speech characteristics, such as Hottentot, is expected to be spoken. Furthermore, adaptive filtering techniques may be employed to vary the ranges with time, perhaps to compensate for an excessive number of packet erasures which likely indicates that the ranges are not optimally set.

In an exemplary implementation, speech is encoded using the aforementioned variable rate encoder of U.S. Pat. No. 5,414,796 at full, half (Rate ½), quarter (Rate ¼) or eighth (Rate ⅛) rates having the CRC bits and encoder tail bits illustrated in FIGS. 2A–2D. A method, represented by pseudocode, for detecting bad packets using LSP frequencies and codebook gain parameters which are extracted or otherwise determined from the received packets, is as follows:

```
If rxrate == full or 1/2{
    if(.66 >= wq(10) or wq(10) <= .985) erase packet
    for(i=5; i<11; i++)
        if(abs(wq(n)-wq(n-4)) < .0931) erase packet
}
If rxrate == 1/4{
    if(.70 >= wq(10) or wq(10) >= .97) erase packet
    for(i=4; I<11; i++)
        if(abs(wq(n)-wq(n-3)) < .08) erase packet
}
if rxrate == 1/4{
    for(i = 0; i < 4; i++)
        if(abs($G_0$(i+1) – $G_0$(i)) > 40) erase packet
```

```
    for(i=0; i<3; i++)
        if(abs(G_O(i+2)–2G_O(i+1) + G_O(i)) > 48) erase packet
}
``` where wq(i) is an ith LSP parameter scaled from 0.0 to 1.0, $G_O(i)$ is an ith Rate ¼ codebook gain parameter represented in dB from 0 to 60 dB, and rxrate is the detected frame rate of full, ½, ¼ or ⅛.

As can be seen, the codebook gain test is applied only to the Rate ¼ packets. This additional test is provided because the probability of receiving an incorrect packet at Rate ¼ is greater than receiving an incorrect packet at Rate ½ or Rate 1. The probability is higher because Rate ¼ has a smaller CRC and because, with the exemplary encoder of U.S. Pat. No. 5,414,796, Rate ¼ is us ed to code only unvoiced or temporally mask ed speech. Hence, Rate ¼ packets are subject to stricter testing. No testing is applied to Rate ⅛ packets.

What has been primarily described is a method and apparatus for detecting bad packets occurring because of frame rate detection errors by comparing speech parameters encoded within, or derivable from, the packets against ranges of acceptable parameters. The techniques also apply to detecting errors caused by other factors as well. Also, techniques of the invention are applicable in other signal transmission systems, including those which do not represent data in packets or which do not employ variable rates. In general, principles of the invention are applicable in almost any system wherein some amount of redundancy occurs in a transmitted signal, i.e. wherein a greater number of bits are employed to encode information than is minimally necessary. Typically, in such systems, all possible data patterns are not equally probable. If the possible data patterns are not equally probable then the techniques of the invention may be exploited to distinguish "good" data from "bad" data based on the probability of occurrence. If all data patterns are equally probably no such distinction can typically be made.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A signal reception system for use in a mobile telephone system, said reception system comprising:

a receiver that outputs a digitized signal containing received speech parameters representative of speech;

a decoder, responsive to a bit rate detection unit, that generates processed speech parameters from the received speech parameters, the processed speech parameters being based at least in part on a detected bit rate of the received speech parameters;

a comparator that compares the processed speech parameters with at least one predetermined range of acceptable speech parameters to identify and discard atypical processed speech parameters outside of said predetermined ranges, the comparing being based at least in part on a rate of change of the processed speech parameters; and a speaker that outputs an audio signal associated with processed speech parameters lying within said predetermined ranges.

2. The system of claim 1, wherein said ranges of acceptable speech parameters are predetermined based on probabilities of encountering ranges of speech parameters in transmitted speech.

3. The system of claim 1, wherein said portions of said digitized signal are variable rate data packets.

4. The system of claim 3, further including means for determining the rate of each packet.

5. The system of claim 3, wherein said packets include cyclic redundancy check (CRC) bits and wherein the system further includes:

means for performing a CRC on each packet using said CRC bits; and means for eliminating packets failing said CRC.

6. The system of claim 1, wherein the receiver, decoder, and speaker are within a mobile telephone.

7. The system of claim 1, wherein said predetermined ranges of acceptable speech parameters are provided in a table.

8. The system of claim 5, wherein said comparator examines packets which were already checked by said means for performing a CRC.

9. A mobile telephone comprising:

means for receiving variable rate packets containing received digitized speech parameters;

means for determining the frame rate of each packet;

means for performing error detection on said packets to identify transmission errors therein or to determine whether the packet is subject to a frame rate detection error;

frame erasure means for eliminating packets found to contain transmission errors or found to be subject to a frame rate detection error;

a decoder, responsive to said means for determining the rate of each packet, tat generates processed speech parameters from the received speech parameters from packets not eliminated by the frame erasure means, the processed speech parameters being based at least in part on the frame rate of the packet;

a comparator that compares the processed speech parameters with at least one preselected range of acceptable speech parameters, the comparing being based at least in part on a rate of change of the processed speech parameters; and means for applying packets having processed speech parameters found to deviate from said preselected ranges of acceptable speech parameters to said frame erasure means.

10. A mobile telephone comprising:

a receiver for outputting packets containing received digitized speech parameters;

a frame rate detection unit for determining the frame rate for each packet;

an error detection unit for performing error detection on said packets to identify transmission errors therein or to determine whether the packet is subject to a frame rate detection error;

a frame erasure unit for eliminating packets found to contain transmission errors or found to be subject to a frame rate detection error;

a decoder, responsive to said frame rate detection unit, that generates processed speech parameters from the received speech parameters from packets not eliminated by the frame erasure unit, the processed speech parameters being based at least in part on the detected frame rate of the packet;

a comparator that compares the processed speech parameters with at least one preselected range of acceptable speech parameters, the comparing being based at least in part on a rate of change of the processed speech parameters; and means for applying packets having processed speech parameters found to deviate from said preselected ranges of acceptable speech parameters to the frame erasure unit.

11. A signal reception method for use in a mobile telephone system, said method comprising the steps of:

receiving a digitized signal containing received speech parameters representative of speech;

decoding, responsive to a detected bit rate, the received speech parameters to generate processed speech parameters, the processed speech parameters being based at least in part on the detected bit rate;

comparing the processed speech parameters with at least one predetermined range of acceptable speech parameters to identify and discard atypical speech parameters outside of said predetermined ranges, said comparing being based at least in part on a rate of change of the processed speech parameters; and outputting, through a speaker, an audio signal associated with processed speech parameters lying within said predetermined ranges.

12. The method of claim 11, wherein said ranges of acceptable speech parameters are predetermined based on probabilities of encountering ranges of speech parameters in transmitted speech.

13. The method of claim 11, wherein said portions of said digitized signal are variable rate data packets.

14. The method of claim 13, further including the step of determining the rate of each packet.

15. The method of claims 13, wherein said packets include cyclic redundancy check (CRC) bits and wherein the method further includes the steps of:

performing a CRC on each packet using said CRC bits; and eliminating packets failing said CRC.

16. The method of claim 11, wherein the steps of receiving, decoding, and outputting are performed by a mobile telephone.

17. The method of claim 11, wherein said predetermined ranges of acceptable speech parameters are provided in a table.

18. The method of claim 15, wherein said step of comparing is performed subsequent to said step of performing a CRC.

19. A method for use in a mobile telephone comprising the steps of:

receiving variable rate packets containing received digitized speech parameters;

determining the frame rate of each packet; performing error detection on frames of said packets to identify transmission errors therein or to determine whether the packet is subject to a frame rate detection error;

eliminating frames found to contain transmission errors or found to be subject to a frame rate detection error;

decoding, responsive to said step of determining the frame rate of each packet, the received speech parameters from frames not eliminated by the step of eliminating frames to thereby generate processed speech parameters, the processed speech parameters being based at least in part on the frame rate of the packet;

comparing the processed speech parameters with at least one preselected range of acceptable speech parameters, said comparing being based at least in part on a rate of change of the processed speech parameters; and eliminating frames having processed speech parameters found to deviate from said preselected ranges of acceptable speech parameters.

* * * * *

US006205130C1

(12) EX PARTE REEXAMINATION CERTIFICATE (7942nd)
United States Patent
DeJaco

(10) Number: US 6,205,130 C1
(45) Certificate Issued: Dec. 21, 2010

(54) METHOD AND APPARATUS FOR DETECTING BAD DATA PACKETS RECEIVED BY A MOBILE TELEPHONE USING DECODED SPEECH PARAMETERS

(75) Inventor: Andrew P. DeJaco, San Diego, CA (US)

(73) Assignee: Qualcomm Incorporated, San Diego, CA (US)

Reexamination Request:
No. 90/010,010, Aug. 15, 2007

Reexamination Certificate for:
Patent No.: 6,205,130
Issued: Mar. 20, 2001
Appl. No.: 08/719,358
Filed: Sep. 25, 1996

(51) Int. Cl.
*G10L 19/00* (2006.01)
*G10L 19/14* (2006.01)
*H03M 13/00* (2006.01)

(52) U.S. Cl. .................. 370/335; 375/264; 455/212; 455/296; 704/220; 704/E19.003

(58) Field of Classification Search ................. None
See application file for complete search history.

(56) References Cited

U.S. PATENT DOCUMENTS

| | | |
|---|---|---|
| 4,608,559 A | 8/1986 | Friedman et al. |
| 4,710,960 A | 12/1987 | Sato |
| 4,757,502 A | 7/1988 | Meuriche et al. |
| 4,777,633 A | 10/1988 | Fletcher et al. |
| 4,802,171 A | 1/1989 | Rasky |
| 4,901,307 A | 2/1990 | Gilhousen et al. |
| 4,969,192 A | 11/1990 | Chen et al. |
| 5,097,507 A | 3/1992 | Zinser et al. |
| 5,103,459 A | 4/1992 | Gilhousen et al. |
| 5,113,400 A | 5/1992 | Gould et al. |

(Continued)

FOREIGN PATENT DOCUMENTS

| | | |
|---|---|---|
| EP | 0731446 | 9/1996 |
| WO | 89009965 | 10/1989 |
| WO | 94029849 | 12/1994 |
| WO | 96009704 | 3/1996 |
| WO | 96018251 | 6/1996 |
| WO | 96019798 | 6/1996 |

OTHER PUBLICATIONS

Jesse W. Fussell, et al.–Providing Channel Error Protection For A 2400 BPS Linear Predictive Coded Voice System, Department of Defense, Fort George G. Meade, Maryland 20755; IEEE CH1285; pp. 462–465.

(Continued)

*Primary Examiner*—Majid A. Banankhah

(57) ABSTRACT

The mobile telephone detects bad data packets by decoding speech parameters represented by the packets and comparing those speech parameters against acceptable ranges of speech parameters. If the speech parameters do not lie within the acceptable ranges, the packets are discarded. This speech parameter-based detection of bad data packets is particularly useful in mobile telephones receiving variable rate data packets wherein an error in determining the rate of a packet results in the entire packet being decoded at an incorrect rate, thereby likely causing an annoying audible artifact in the decode speech signal. Such rate detection errors can occur even though a CRC or other conventional error detection check fails to detect the bad packet. In an exemplary implementation, the mobile telephone receives signals encoded with TIA/EIA/IS-95-A standards. Linear speech parameter frequencies and codebook gain parameters determined using linear predictive coding techniques are tested against acceptable ranges to detect bad data packets.

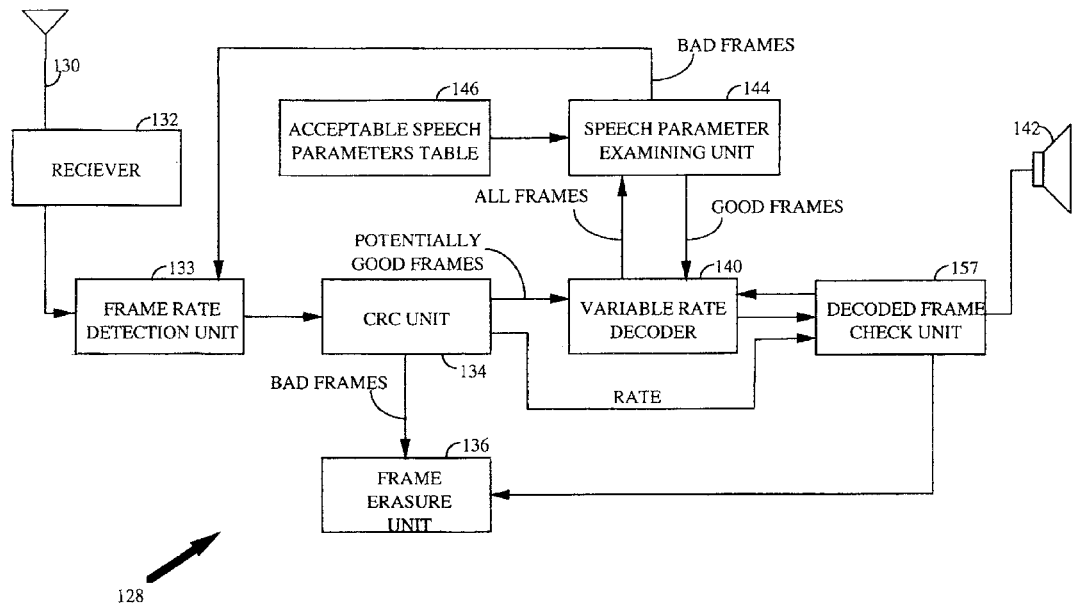

U.S. PATENT DOCUMENTS

| | | | |
|---|---|---|---|
| 5,115,207 | A | 5/1992 | Fry |
| 5,142,582 | A | 8/1992 | Asakawa et al. |
| 5,208,812 | A | 5/1993 | Dudek et al. |
| 5,309,443 | A | 5/1994 | Schorman |
| 5,414,796 | A | 5/1995 | Jacobs et al. |
| 5,416,779 | A | 5/1995 | Barnes et al. |
| 5,461,639 | A | 10/1995 | Wheatley, II et al. |
| 5,463,662 | A | 10/1995 | Sutterlin et al. |
| 5,495,555 | A | 2/1996 | Swaminathan |
| 5,497,383 | A | 3/1996 | Thome et al. |
| 5,517,511 | A | 5/1996 | Hardwick et al. |
| 5,535,239 | A | 7/1996 | Padovani et al. |
| 5,537,410 | A | 7/1996 | Li |
| 5,541,955 | A | 7/1996 | Jacobsmeyer |
| 5,550,543 | A | 8/1996 | Chen et al. |
| 5,557,639 | A | 9/1996 | Heikkila et al. |
| 5,572,622 | A | 11/1996 | Wigren et al. |
| 5,596,676 | A | 1/1997 | Swaminathan et al. |
| 5,598,506 | A | 1/1997 | Wigren et al. |
| 5,615,298 | A | 3/1997 | Chen et al. |
| 5,615,412 | A | 3/1997 | Doran |
| 5,619,508 | A | 4/1997 | Davis et al. |
| 5,657,420 | A | 8/1997 | Jacobs et al. |
| 5,659,569 | A | 8/1997 | Padovani et al. |
| 5,699,481 | A | 12/1997 | Shlomot et al. |
| 5,815,507 | A | 9/1998 | Vinggaard et al. |
| 5,862,518 | A | 1/1999 | Nomura et al. |
| 5,867,814 | A | 2/1999 | Yong |
| 5,870,405 | A | 2/1999 | Hardwick et al. |
| 5,918,204 | A | 6/1999 | Tsurumaru |
| 5,970,399 | A | 10/1999 | Rostamy et al. |
| 6,021,385 | A | 2/2000 | Jarvinen |
| 6,148,422 | A | 11/2000 | Strawczynski et al. |
| 6,205,130 | B1 | 3/2001 | DeJaco |
| 7,184,954 | B1 | 2/2007 | Jacobs et al. |

OTHER PUBLICATIONS

International Search Report–PCT/US97/017042, International Search Authority–European Patent Office, Jan. 29, 1998.

O. Sereno, "Frame Substitution and Adaptive Post–Filtering in Speech Coding," CSELT Technical Reports, Mar. 1992, pp. 15–19, vol. 20 – No. 1.

J.H. Chen et al., "Real–Time Vector APC Speech Coding At 4800 BPS with Adaptive Postfiltering," ICASSP, 1987.

3GPP2 C. S0009–0, 3rd Generation Partnership Project 2 "3GPP2", "Speech Service Option Standard for Wideband Spread Spectrum Systems" Section 2.4.8.

TIA/EIA/IS–95–A Mobile Station–Base Station Compatibility Standard for Dual–Mode Wideband Spread Spectrum Cellular System, Sections 6 1.3.11 and 6.2.2.2.

Dejaco, A. et al., "QCELP: The North American CDMA Digital Cellular Variable Rate Speech Coding Standard," IEEE Workshop on Speech Coding for Telecommunications, Oct. 13–15, 1993, pp. 5–6.

Gersho, A., "Advances in Speech and Audio Compression," Proceedings of the IEEE, vol. 2, No. 6, Jun. 1994, pp. 900–918.

Kleijn, W.B. et al., "Fast Methods for the CELP Speech Coding Algorithm," IEEE Transactions on Acoustics, Speech, and Signal Processing [see also IEEE Transactions on Signal Processing], vol. 38, No. 8, Aug. 1990, pp. 1330–1342.

Rabiner, L.R. et al., "Digital Processing of Speech Signals," Prentice Hall, Inc., Englewood, N.J., ch. 8, "Linear Predictive Coding of Speech," pp. 396–455.

Schroeder, M., et al., "Code–excited linear prediction (CELP), High–quality speech at very low bit rates," IEEE International Conference on Acoustics, Speech, and Signal Processing ("ICASSP '85"), vol. 10, Apr. 1985, pp. 937–940.

Tremain, T. et al., "A 4.8 KBPS Code Excited Linear Predictive Coder," Proceedings of the Mobile Satellite Conference, 1988, pp. 491–496.

Paksoy, E. et al, "Variable Rate Speech Coding with Phonetic Segmentation," IEEE International Conference on Acoustics, Speech, and Signal Processing ("ICASSP"), vol. 2, Apr. 27–30, 1993, pp. 155–158.

Srinivasan, K., et al., "Voice Activity Detection for Cellular Networks," IEEE Workshop on Speech Coding for Telecommunications, 1993, Oct. 13–15, 1993, pp. 85–86.

Southcott, C.B., et al., "Voice Control of the Pan–European Digital Mobile Radio System," IEEE Global Telecommunications Conference. 1989, and Exhibition. Communications Technology for the 1990s and Beyond ("Globecom '89"), vol. 2, Nov. 27–30, 1989, pp. 1070–1074 vol. 2.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9, 10 and 19 is confirmed.

Claims 1, 3, 5, 11, 13, 14 and 15 are determined to be patentable as amended.

Claims 2, 4, 6, 7, 8, 12, 16, 17 and 18, dependent on an amended claim, are determined to be patentable.

1. A signal reception system for use in a mobile telephone system, said reception system comprising:
- a receiver that outputs [a digitized signal] *packets* containing received speech parameters representative of speech;
- *an error detection unit for performing error detection on the packets to identify transmission errors therein or to determine whether the packets are subject to a frame rate detection error;*
- *a frame erasure unit, responsive to the error detection unit, for discarding any packets with either transmission errors or a frame rate detection error;*
- a decoder, responsive to a bit rate detection unit, that generates processed speech parameters from the received speech parameters *of packets that pass the error detection unit*, the processed speech parameters being based at least in part on a detected bit rate of the received speech parameters;
- a comparator that compares the processed speech parameters with at least one predetermined range of acceptable speech parameters to identify and discard *packets containing* atypical processed speech parameters outside of said predetermined ranges, the comparing being based at least in part on a rate of change of the processed speech parameters; and
- a speaker that outputs an audio signal associated with processed speech parameters lying within said predetermined ranges.

3. The system of claim 1, wherein said [portions of said digitized signal] *packets* are variable rate data packets.

5. The system of claim 3, wherein said packets include cyclic redundancy check (CRC) bits and wherein the [system] *error detection unit* further includes:
- means for performing a CRC on each packet using said CRD bits[; and means for eliminating packets failing said CRC].

11. A signal reception method for use in a mobile telephone system, said method comprising the steps of:
- receiving a [digitized signal] *packet* containing received speech parameters representative of speech;
- *performing error detection of the packet to identify transmission errors therein or to determine whether the packet is subject to a frame rate detection error;*
- *discarding the packet if either transmission errors or frame rate detection error has been detected;*
- decoding responsive to a detected bit rate, the received speech parameters to generate processed speech parameters *of the packet if transmission errors or frame rate detection errors have not been detected in the packet*, the processed speech parameters being based at least in part on the detected bit rate;
- comparing the processed speech parameters with at least one predetermined range of acceptable speech parameters to identify and discard *the packet if* atypical speech parameters outside of said predetermined ranges *is determined*, said comparing being based at least in part on a rate of change of the processed speech parameters; and
- outputting, through a speaker, an audio signal associated with processed speech parameters lying within said predetermining ranges.

13. The method of claim 11, wherein said [portions of said digitized signal are] *packet is a* variable rate data [packets] *packet*.

14. The method of claim 13, further including the step of determining the rate of [each] *the* packet.

15. The method of claims 13, wherein [said packets include] *the packet includes* cyclic redundancy check (CRC) bits and wherein the method further includes the [steps] *step* of:
- performing a CRC on [each] *the* packet using said CRC bits[; and eliminating packets failing said CRC].

* * * * *